United States Patent
Li et al.

(10) Patent No.: US 8,854,817 B2
(45) Date of Patent: Oct. 7, 2014

(54) ELECTRONIC DEVICE HAVING FIXING MEMBER

(75) Inventors: Shih-Yao Li, New Taipei (TW); Jui-Wen Hung, New Taipei (TW); Wei-Jen Huang, New Taipei (TW)

(73) Assignee: Foxconn Technology Co., Ltd., New Taipei (TW)

( * ) Notice: Subject to any disclaimer, the term of this patent is extended or adjusted under 35 U.S.C. 154(b) by 133 days.

(21) Appl. No.: 13/570,279

(22) Filed: Aug. 9, 2012

(65) Prior Publication Data

US 2013/0342994 A1  Dec. 26, 2013

(30) Foreign Application Priority Data

Jun. 26, 2012 (TW) .............................. 101122893 A

(51) Int. Cl.
*H05K 7/20* (2006.01)
*F28D 15/00* (2006.01)

(52) U.S. Cl.
USPC ..................... 361/700; 165/104.33; 165/80.4; 361/709; 361/697; 248/276.1

(58) Field of Classification Search
CPC .................. G06F 1/16–1/1654; G06F 1/1656; G06F 1/1662–1/1681; G06F 1/1684–1/189; G06F 2200/201; G06F 2200/202; G06F 2200/203; H05K 5/0026–5/0082; H05K 7/005–7/08; H05K 7/1422; H05K 5/00–5/0021; H05K 5/0086–5/06; H05K 5/069; H05K 7/20; H05K 1/0218–1/0219; H05K 1/00; H05K 3/00; H05K 7/00; H05K 9/00; H01G 2/00; H01G 4/00; H01G 5/00; H01G 7/00; H01G 9/00–9/155; H01G 11/00; H02G 3/00; H02G 5/00; H02G 7/00; H02G 9/00; H02G 11/00; H02G 13/00; H02G 15/00; H01B 7/00; H01B 11/00; H01B 17/00; H02B 1/00; H01R 4/00; H01R 9/00; H01R 13/00; H01K 1/00–3/00; H01H 37/00
USPC .................... 361/688–723, 679.46–679.54; 284/276.1, 281.11, 282.1, 287.1, 917; 165/80.1–80.5, 104.33, 185; 257/712–722; 174/15.1–15.2, 174/16.1–16.3
See application file for complete search history.

(56) References Cited

U.S. PATENT DOCUMENTS

| | | | | |
|---|---|---|---|---|
| 5,662,163 | A * | 9/1997 | Mira | 165/80.3 |
| 6,917,522 | B1 * | 7/2005 | Erturk et al. | 361/700 |
| 7,636,240 | B2 * | 12/2009 | Kim | 361/700 |
| 7,942,195 | B2 * | 5/2011 | Chen et al. | 165/80.4 |
| 2006/0034057 | A1 * | 2/2006 | Yang | 361/704 |
| 2007/0230136 | A1 * | 10/2007 | Chen | 361/719 |
| 2007/0263363 | A1 * | 11/2007 | Liu et al. | 361/719 |
| 2008/0130243 | A1 * | 6/2008 | Chang | 361/720 |
| 2012/0162919 | A1 * | 6/2012 | Lin | 361/704 |

* cited by examiner

*Primary Examiner* — Zachary M Pape
*Assistant Examiner* — Razmeen Gafur
(74) *Attorney, Agent, or Firm* — Novak Druce Connolly Bove + Quigg LLP

(57) ABSTRACT

An exemplary electronic device includes an electronic component, a heat dissipation device, a fixing member and a casing contained the electronic component, the heat dissipation device and the fixing member therein. The heat dissipation device thermally contacts the electronic component. The fixing member includes a main body and an engaging portion extending from the main body. The engaging portion fixes the heat dissipation device to the fixing member. Fasteners extend through the casing and engage the main body of the fixing member to secure the fixing member on the casing.

17 Claims, 5 Drawing Sheets

ELECTRONIC DEVICE HAVING FIXING MEMBER

BACKGROUND

1. Technical Field

The disclosure generally relates to an electronic device having a casing, a fixing member, and a heat dissipation device, with the fixing member fixing the heat dissipation device to the casing to improve the stable and reliable performance of the electronic device.

2. Description of Related Art

A conventional electronic device includes a casing, and an electronic component and a heat dissipation device both received in the casing. The heat dissipation device thermally contacts the electronic component. Unwanted vibration is usually generated when the electronic device is in use or transported. Due to the vibration, the heat dissipation device is prone to move away from its original position, and may even interfere with other elements in the casing. Once this happens, the normal functions and capabilities of the electronic device are liable to be adversely affected.

What is needed, therefore, is an improved electronic device to overcome the above described shortcomings.

DETAILED DESCRIPTION

Embodiments of an electronic device will now be described in detail below and with reference to the drawings.

Figure 1:
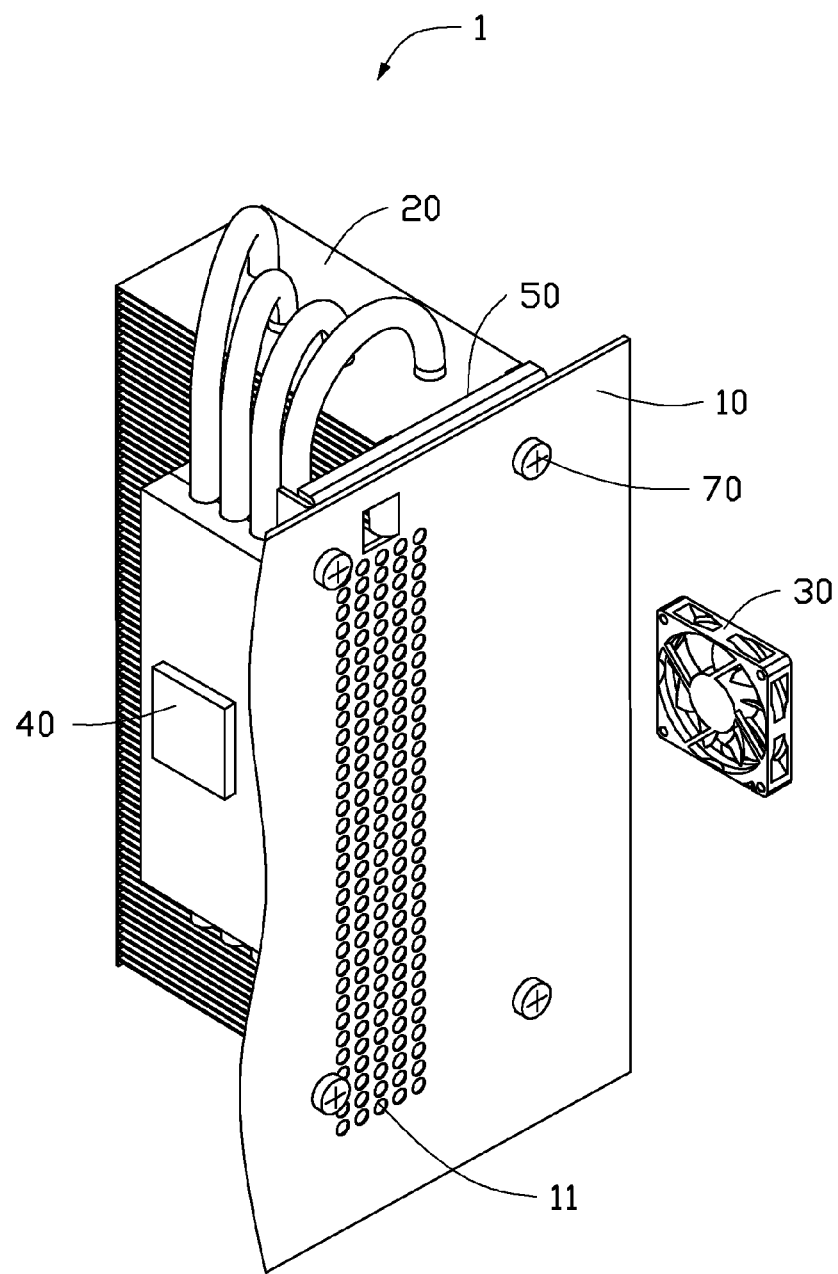
FIG. 1 is an isometric, assembled, cutaway view of part of an electronic device of a first embodiment of the present disclosure.

Referring to FIG. 1, an electronic device 1 in accordance with a first embodiment of the present disclosure is shown. The electronic device 1 includes a casing 10, a heat dissipation device 20, a fixing member 50, a system fan 30, and an electronic component 40. The casing 10 encloses the heat dissipation device 20, the fixing member 50, the system fan 30 and the electronic component 40 therein. In FIG. 1, only part of the casing 10 is shown. The fixing member 50 fixes the heat dissipation device 20 to the casing 10. The heat dissipation device 20 thermally contacts the electronic component 40, to absorb heat generated therefrom and subsequently dissipate the heat.

Figure 2:
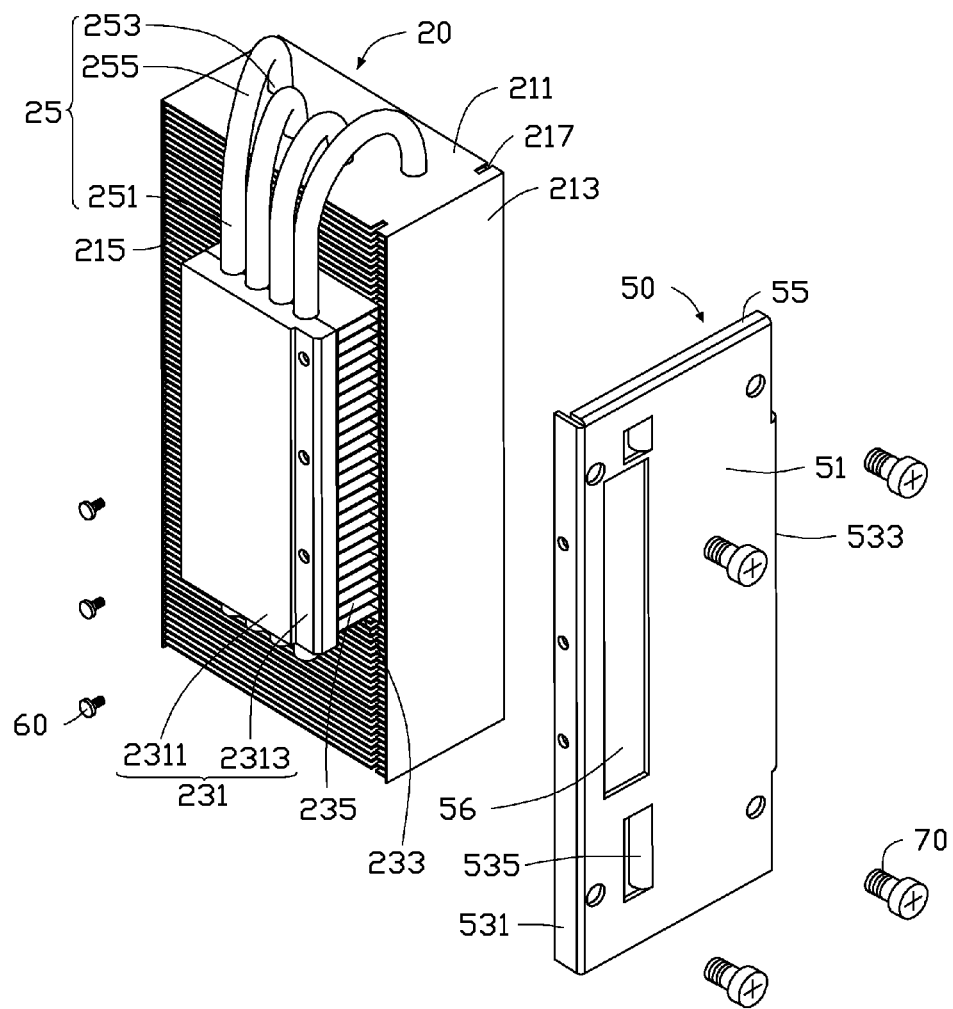
FIG. 2 is similar to FIG. 1, but omitting a casing, an electronic component and a system fan, and showing a fixing member disassembled from a heat dissipation device of the electronic device.
Figure 3:
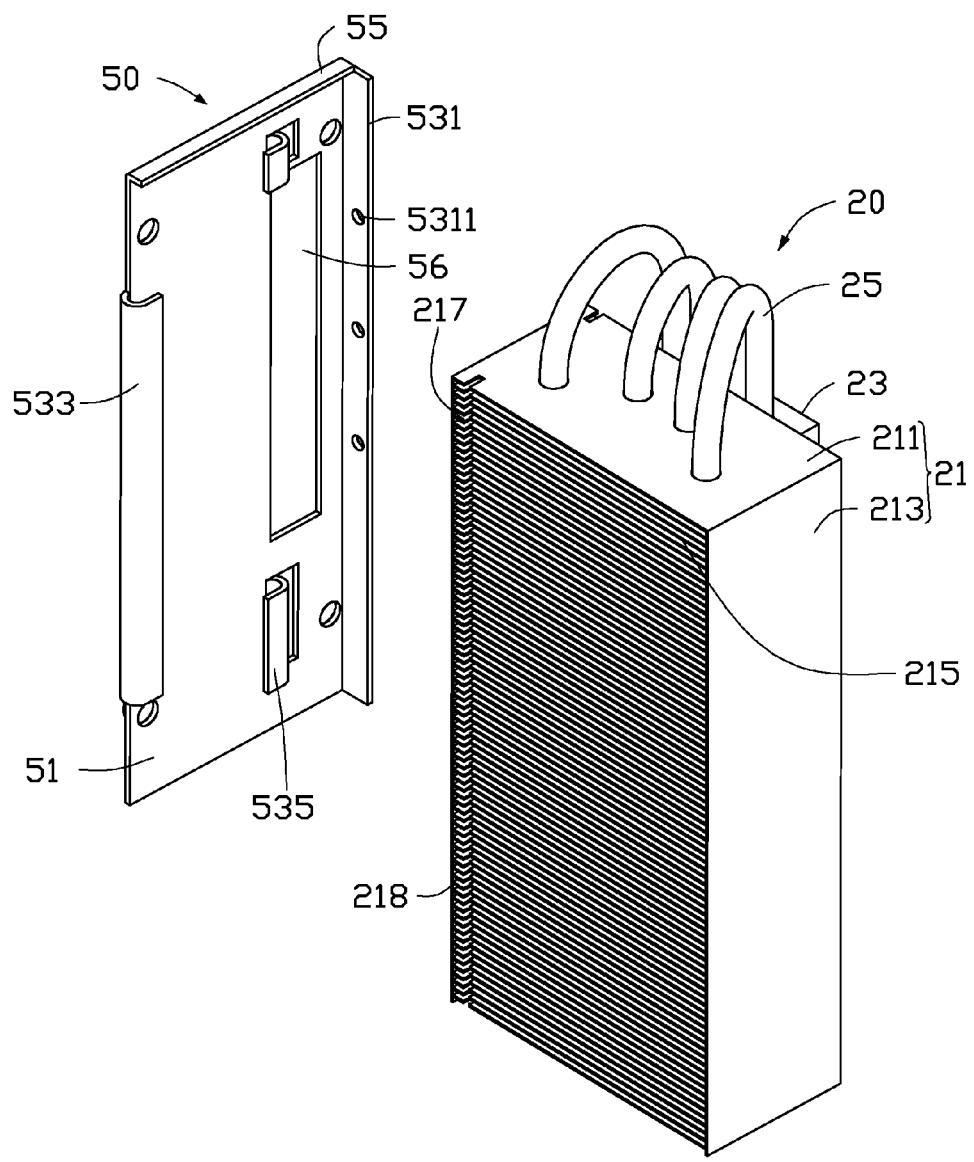
FIG. 3 is similar to FIG. 2, but showing another aspect of the fixing member and the heat dissipation device.

Referring also to FIGS. 2 and 3, the heat dissipation device 20 includes a heat dissipation unit 21, a heat absorbing unit 23, and a plurality of heat pipes 25 connecting the heat dissipation unit 21 and the heat absorbing unit 23. In the following description, unless the context indicates otherwise, a reference to the "front" of something refers to a side of the thing farthest away from a viewer of FIG. 1 and facing obliquely rightward; and a reference to the "rear" of something refers to a side of the thing nearest the viewer of FIG. 1 and facing obliquely leftward.

The heat dissipation unit 21 includes a plurality of stacked first fins 211, and two side sheets 213 covering two opposite lateral sides of the stack of first fins 211. Each first fin 211 is a rectangular sheet. Each side sheet 213 is an elongated sheet. The first fins 211 are stacked parallel to each other along a vertical direction of the heat dissipation unit 21, and are aligned with and spaced from each other. The first fins 211 are located between the side sheets 213, and opposite ends of each of the first fins 211 respectively connect inner surfaces of the side sheets 213. A first air passage 214 is defined between each two adjacent first fins 211. Lateral ends of the first air passage 214 are closed by the side sheets 213. Front and rear sides of the first air passage 214 are open, to guide air flowing therethrough.

The front and rear sides of each first fin 211 respectively define a cutout (not labeled) therein. The cutouts are directly opposite each other, and are both located near a same side sheet 213. The cutouts at the front sides of the first fins 211 communicate with each other and cooperatively define a receiving slit 217 along the vertical direction of the heat dissipation unit 21. Similarly, the cutouts at the rear sides of the first fins 211 communicate with each other and cooperatively define another receiving slit 217 along the vertical direction of the heat dissipation unit 21. A portion of the stack of first fins 211 between the front receiving slit 217 and the adjacent side sheet 213 defines a protruding portion 218. A portion of the stack of first fins 211 between the rear receiving slit 217 and the adjacent side sheet 213 defines another protruding portion 218. The system fan 30 is located at a front side of the heat dissipation unit 21, but is spaced a distance away from the heat dissipation unit 21.

A size of the heat absorbing unit 23 is smaller than that of the heat dissipation unit 21. The heat absorbing unit 23 is located at a rear side of the heat dissipation unit 21, is spaced from the heat dissipation unit 21, and faces toward a central portion of the rear side of the heat dissipation unit 21. The heat absorbing unit 23 includes a base 231, and a plurality of second fins 233 each perpendicularly mounted on a front side of the base 231. The base 231 is made of material with a high heat conductivity coefficient, such as copper. The base 231 includes an elongated heat absorbing portion 2311, and an elongated mounting portion 2313 extending outwardly from a lateral side of the heat absorbing portion 2311. Front surfaces of the heat absorbing portion 2311 and the mounting portion 2313 are coplanar and face the heat dissipation unit 21; thus the base 231 has a single front surface. Rear surfaces of the heat absorbing portion 2311 and the mounting portion 2313 are parallel to each other and located at different distances from the front surface of the base 231. A distance between the front surface and the rear surface of the mounting portion 2313 is smaller than a distance between the front surface and the rear surface of the heat absorbing portion 2311. Thus, an exposed part of the lateral side of the heat absorbing portion 2311 and the rear surface of the mounting portion 2313 cooperatively define an L-shaped step.

The rear surface of the heat absorbing portion 2311 directly contacts the electronic component 40 to absorb heat generated therefrom. The second fins 233 are each perpendicularly mounted on the front surface of the base 231, to dissipate heat from the base 231. Each second fin 233 is rectangular. The second fins 233 are parallel to and spaced from each other. A second air passage 235 is defined between each two adjacent second fins 233. Rear sides of the second air passages 235 are closed by the base 231. Front sides and lateral ends of the second air passages 235 are open, to guide air flowing therethrough. The front sides of the second air passages 235 face and communicate with the first air passages 215 of the heat dissipation unit 21.

Each heat pipe 25 has a U-shaped configuration, and includes a straight evaporating section 251, a straight condensing section 253, and a C-shaped connecting section 255 interconnecting the evaporating section 251 and the condensing section 253. All the evaporating sections 251 of the heat pipes 25 are embedded in both the front side of the base 231 of the heat absorbing unit 23 and rear sides of the second fins 233. The evaporating sections 251 are evenly spaced from each other, and are located at a central portion of the base 231. The condensing sections 253 extend through the first fins 211 of the heat dissipation unit 21 from top to bottom. The connecting sections 255 are located at a top of the heat dissipation unit 21. In this embodiment, there are four heat pipes 25. Two of the condensing sections 253 are located in a central portion of the heat dissipation unit 21, and the other two condensing sections 253 are located adjacent to opposite lateral sides of the heat dissipation unit 21, respectively. Thus, the condensing sections 253 can quickly and evenly transmit heat from the heat absorbing unit 23 to the heat dissipation unit 21 for dissipation.

Figure 4:
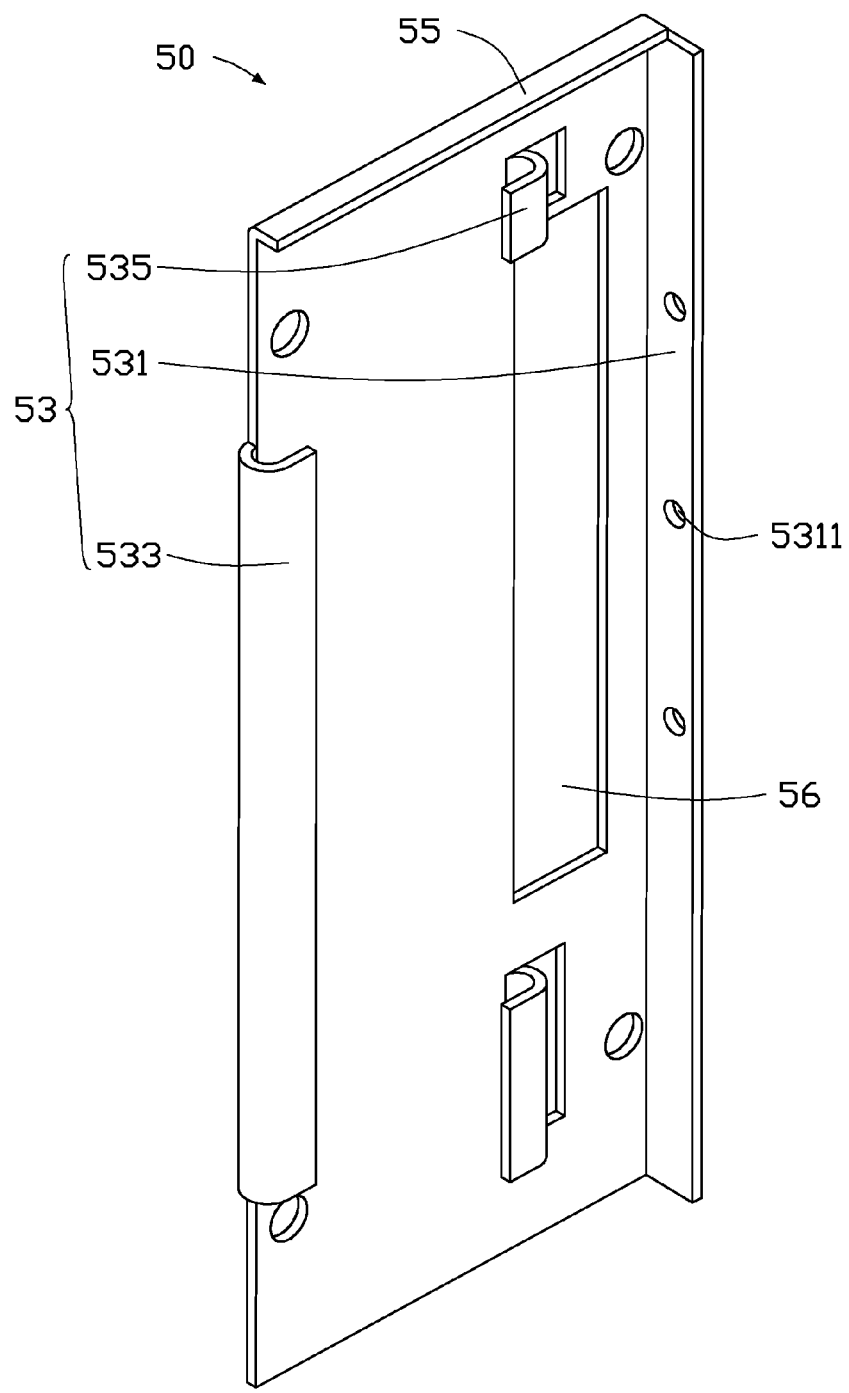
FIG. 4 is an enlarged view of the fixing member of FIG. 3.

Referring also to FIG. 4, the fixing member 50 is an elastic plate. The fixing member 50 includes a main body 51, and an engaging portion 53 and a stopping portion 55 extending from the main body 51. The main body 51 is an elongated plate. The engaging portion 53 includes a fixing arm 531 and a first clasp 533 extending from opposite rear and front sides of the main body 51, respectively, and two aligned second clasps 535 extending from a central portion of the main body 51. Each of the fixing arm 531, the first clasp 533, and the second clasps 535 has elastic resiliency. The fixing arm 531 is an elongated plate, and perpendicularly extends from the rear side of the main body 51. A length of the fixing arm 531 is equal that of the main body 51. Opposite ends of the fixing arm 531 are respectively coplanar with opposite ends of the main body 51. A plurality of through holes 5311 is defined in the fixing arm 531 along a longitudinal direction thereof, to allow screws 60 (see FIG. 2) to extend therethrough and engage with the heat absorbing unit 23.

The first clasp 533 is bent from a central portion of the front side of the main body 51, with a free end of the first clasp 533 oriented towards the fixing arm 531. Thus the first clasp 533 is a generally J-shaped sheet. The first clasp 533 is used to insert into the front receiving slit 217 of the heat dissipation unit 21, to abut against the front side of the heat dissipation unit 21 at the front protruding portion 218.

The second clasps 535 are spaced from each other, being adjacent to opposite top and bottom ends of the main body 51. The second clasps 535 are located between the fixing arm 531 and the first clasp 533, and are bent from the main body 51 such that free ends of the second clasps 535 are oriented towards the first clasp 533. Thus each second clasp 535 is a generally J-shaped sheet. The second clasps 535 are used to insert into the rear receiving slit 217 of the heat dissipation unit 21, to abut against the rear side of the heat dissipation unit 21 at the rear protruding portion 218.

The stopping portion 55 is an elongated plate, and perpendicularly extends from a top end of the main body 51 to abut against a top end of the heat dissipation unit 21. The stopping portion 55 is perpendicular to the fixing arm 531. One end of the stopping portion 55 connects one end of the fixing arm 531. A slot 56 is defined in the main body 51 along the longitudinal direction of the main body 51, and is located between the second clasps 535.

In assembly of the electronic device 1, the first clasp 533 and the pair of second clasps 535 are pulled so that they elastically move further apart, and the corresponding lateral side of the heat dissipation unit 21 is positioned between the first clasp 533 and the pair of second clasps 535. Then the first clasp 533 and the pair of second clasps 535 are released, and elastically rebound toward each other. Thus the first clasp 533 and the pair of second clasps 535 are received in the corresponding receiving slits 217 and abut against the opposite front and rear sides of the heat dissipation unit 21. Thereby, the first clasp 533 and the pair of second clasps 535 clasp the corresponding protruding portions 218 of the heat dissipation unit 21. In this state, the heat dissipation unit 21 is fixed to the fixing member 50, with one of the side sheets 213 of the heat dissipation unit 21 abutting an inner surface of the main body 51, the top end of the heat dissipation unit 21 abutting the stopping portion 55, and the heat absorbing unit 23 being located between the pair of second clasps 535 and the fixing arm 531. The fixing arm 531 is received in the step of the heat absorbing unit 23. The screws 60 are extended through the through holes 5311 of the fixing arm 531 and engaged with the mounting portion 2313 of the base 231, to fix the heat absorbing unit 23 to the fixing member 50. A lateral side of the heat absorbing unit 23 abuts the inner surface of the main body 51. The second air passages 235 of the heat absorbing unit 23 face and communicate with the slot 56 of the main body 51.

An outer surface of the main body 51 opposite to the inner surface is arranged on a part of an inner surface of the casing 10. Screws 70 are extended through the casing 10 and engaged with the fixing member 50, to fix the fixing member 50 on the casing 10. A multiplicity of apertures 11 is defined in the casing 10, with the apertures 11 arranged in an m×n array (or matrix). The apertures 11 communicate with the slot 56 of the main body 51. In this state, the heat dissipation device 20 is fixed to the casing 10 by the fixing member 50. Accordingly, unwanted movement of the heat dissipation device 20 can be avoided; for example, when the electronic device 1 sustains vibration. Thus, the stable and reliable performance of the electronic device 1 is enhanced.

In operation of the electronic device 1, the base 231 of the absorbing unit 23 absorbs heat generated from the electronic component 40. Then a part of the heat is directly dissipated by the second fins 233, and another part of the heat transfers to the heat dissipation unit 21 via the heat pipes 25 for dissipation. Cooling air generated from the system fan 30 flows through the first air passages 215 of the heat dissipation unit 21 from the front sides thereof to the rear sides thereof, to cool the heat dissipation unit 21; and then flows into the second air passages 235 to cool the heat absorbing unit 23; and finally flows out from the second air passages 235 to an exterior of the casing 10 via the slot 56 and the apertures 11.

Figure 5:
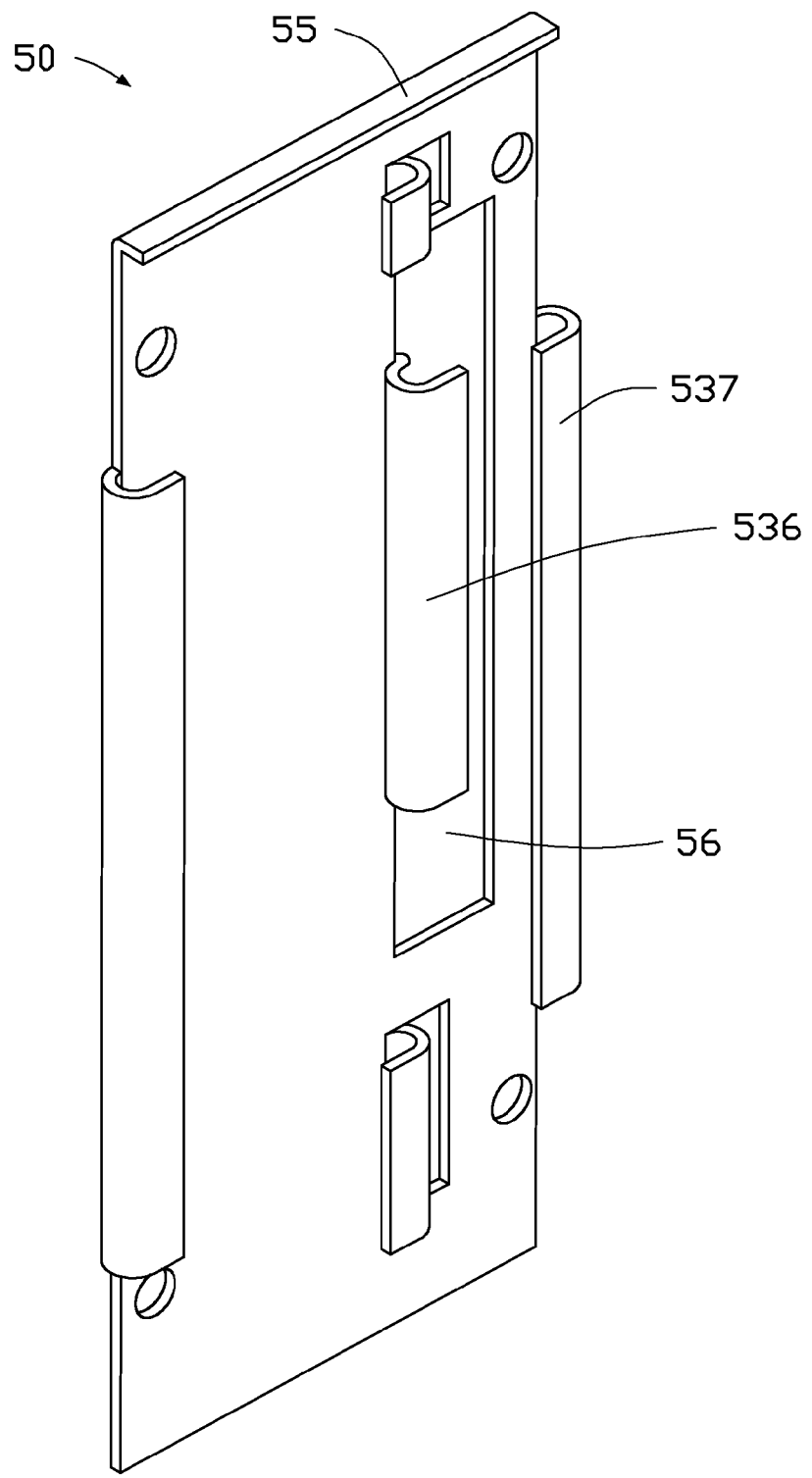
FIG. 5 is an isometric view of a fixing member of a second embodiment of the present disclosure.

Referring to FIG. 5, in a second embodiment, a third clasp 536 and a fourth clasp 537 may replace the fixing arm 531 of the first embodiment to fix the heat absorbing unit 23 on the fixing member 50. The third clasp 536 and the fourth clasp 537 are respectively formed at opposite front and rear sides of the slot 56, and bend from the main body 51 such that free ends of the third clasp 536 and the fourth clasp 537 are oriented towards each other. The third clasp 536 and the fourth clasp 537 are used to abut against opposite front and rear sides of the mounting portion 2313 of the heat absorbing unit 23.

It is to be further understood that even though numerous characteristics and advantages of the present embodiments have been set forth in the foregoing description, together with details of the structures and functions of the embodiments, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. An electronic device comprising:
   an electronic component;
   a heat dissipation device thermally contacting the electronic component and adapted to absorb heat generated from the electronic component and dissipate the heat;
   a casing containing the electronic component and the heat dissipation device therein;
   a fixing member received in the casing and comprising a main body and an engaging portion extending from the main body; and
   a plurality of fasteners;
   wherein the engaging portion fixes the heat dissipation device to the fixing member, and the fasteners extend through the casing and are engaged with the main body of the fixing member to secure the fixing member on the casing;
   wherein the engaging portion comprises a first clasp and a second clasp protruded from the main body and spaced from and oriented towards each other, the heat dissipation device comprises a heat dissipation unit, the heat dissipation unit is positioned between the first clasp and the second clasp, and the first clasp and the second clasp elastically abut against opposite sides of the heat dissipation unit to fix the heat dissipation unit on the fixing member, the fixing member further comprises a fixing arm located at a lateral side of the second clasp, the heat dissipation device further comprises a heat absorbing unit adjacent to the heat dissipation unit, and a plurality of fasteners extends through the fixing arm and is engaged with the heat absorbing unit to fix the heat absorbing unit on the fixing member.

2. The electronic device of claim 1, wherein two receiving slits are respectively defined in the opposite sides of the heat dissipation unit, and the first clasp and the second clasp are respectively inserted into the receiving slits and elastically abut against the opposite sides of the heat dissipation unit.

3. The electronic device of claim 2, wherein the heat dissipation unit comprises two protruding portions located on outer sides of the receiving slits, respectively, and the first clasp and the second clasp respectively clasp the protruding portions.

4. The electronic device of claim 3, wherein the engaging portion further comprises a third clasp and a fourth clasp spaced from and oriented toward each other, the heat dissipation device further comprises a heat absorbing unit adjacent to the heat dissipation unit and located between the third clasp and the fourth clasp, and the third clasp and the fourth clasp respectively elastically abut against opposite sides of the heat absorbing unit to fix the heat absorbing unit to the fixing member.

5. The electronic device of claim 1, wherein the heat absorbing unit comprises a base directly contacting the electronic component and a plurality of second fins mounted on a front side of the base, and the fasteners are engaged with a rear side of the base.

6. The electronic device of claim 5, wherein the second fins are spaced from each other and a second air passage is defined between each two adjacent second fins, a slot is defined in the main body of the fixing member facing and communicating with the second air passages, and a plurality of apertures is defined in the casing communicating with the slot of the main body, and thereby an airflow path is defined through the second air passages, the slot and the apertures for exhausting of air from the casing.

7. The electronic device of claim 6, wherein the heat dissipation unit comprises a plurality of first fins spaced from each other, a first air passage is defined between each two adjacent first fins, and the first air passages communicate with the second air passages, and thereby an airflow path is defined through the first air passages and the second air passages.

8. The electronic device of claim 5, wherein the heat dissipation device further comprises a plurality of heat pipes, and the heat pipes interconnect the heat dissipation unit and the heat absorbing unit.

9. The electronic device of claim 8, wherein each heat pipe comprises an evaporating section, a condensing section and a connecting section interconnecting the evaporating section and the condensing section, the evaporating sections extend through the base of the absorbing unit, and the condensing sections extend through the heat dissipation unit.

10. The electronic device of claim 1, wherein the fixing member further comprises a stopping portion bent from a top end thereof, and the stopping portion abuts a top end of the heat dissipation unit.

11. An electronic device comprising:
    an electronic component;
    a heat dissipation device thermally contacting the electronic component to absorb heat generated from the electronic component, the heat dissipation device comprising two protruding portions on opposite sides thereof;
    a casing containing the electronic component and the heat dissipation device therein;
    a fixing member received in the casing and comprising a main body and a first clasp and a second clasp both extending from the main body, the first and second clasps spaced from each other; and
    a plurality of fasteners;
    wherein the first clasp and the second clasp respectively clasp the protruding portions of the heat dissipation device to fix the heat dissipation device to the fixing member, and the fasteners extend through the casing and are engaged with the main body of the fixing member to secure the fixing member on the casing;
    wherein the heat dissipation device comprises a heat dissipation unit, a heat absorbing unit and a heat pipe connecting the heat dissipation unit and the heat absorbing unit, the protruding portions are formed on opposite sides of the heat dissipation unit, and the heat absorbing unit contacts the electronic component, the fixing member further comprises a fixing arm extending from the main body and located at a lateral side of the second clasp, and fasteners extend through the fixing arm and engage an outer side of the heat absorbing unit to fix the heat absorbing unit to the fixing member.

12. The electronic device of claim 11, wherein the heat dissipation unit and the heat absorbing unit are located between the first clasp and lateral sides thereof abut the main body.

13. The electronic device of claim 12, wherein the heat dissipation unit comprises a plurality of first air passages, the heat absorbing unit comprises a plurality of second air passages facing and communicating the first air passages, a slot is defined in the main body, a plurality of apertures is defined in the casing, cool air flows through the first air passages, the second air passages, the slot and the apertures in series.

14. The electronic device of claim 13, wherein the heat dissipation unit comprises a plurality of first fins spaced from each other, and the first air passage is defined between each two adjacent first fins.

15. The electronic device of claim 13, wherein the heat absorbing unit comprises a base directly contacting the electronic component and a plurality of second fins mounted on a front side of the base, and the second passage is defined between each two adjacent second fins.

16. The electronic device of claim 11, wherein the fixing member further comprises a third clasp and a fourth clasp spaced from and oriented toward each other, the heat absorbing unit is located between the third clasp and the fourth clasp, and the third clasp and the fourth clasp respectively elastically abut against opposite sides of the heat absorbing unit.

17. An electronic device comprising:
an electronic component;
a heat dissipation device thermally contacting the electronic component and adapted to absorb heat generated from the electronic component and dissipate the heat;
a casing containing the electronic component and the heat dissipation device therein;
a fixing member received in the casing and comprising a main body and an engaging portion extending from the main body; and
a plurality of fasteners;
wherein the engaging portion fixes the heat dissipation device to the fixing member, and the fasteners extend through the casing and are engaged with the main body of the fixing member to secure the fixing member on the casing, the engaging portion comprises a first clasp, a second clasp protruded from the main body and spaced from and oriented towards each other, a third clasp and a fourth clasp spaced from and oriented toward each other, the heat dissipation device comprises a heat dissipation unit and a heat absorbing unit adjacent to the heat dissipation unit and located between the third clasp and the fourth clasp, the heat dissipation unit is positioned between the first clasp and the second clasp, and the first clasp and the second clasp elastically abut against opposite sides of the heat dissipation unit to fix the heat dissipation unit on the fixing member, two receiving slits are respectively defined in the opposite sides of the heat dissipation unit, and the first clasp and the second clasp are respectively inserted into the receiving slits and elastically abut against the opposite sides of the heat dissipation unit, the heat dissipation unit comprises two protruding portions located on outer sides of the receiving slits, respectively, and the first clasp and the second clasp respectively clasp the protruding portions, and the third clasp and the fourth clasp respectively elastically abut against opposite sides of the heat absorbing unit to fix the heat absorbing unit to the fixing member.

* * * * *